US009907191B2

(12) United States Patent
Shi et al.

(10) Patent No.: US 9,907,191 B2
(45) Date of Patent: Feb. 27, 2018

(54) MULTI-PART ELECTRONIC DEVICE HOUSING HAVING CONTIGUOUS FILLED SURFACE

(71) Applicant: Apple Inc., Cupertino, CA (US)

(72) Inventors: Ming Kun Shi, Cupertino, CA (US); Lindsay D. Corbet, Cupertino, CA (US); Christopher Bruni, Cupertino, CA (US); Collin D. Chan, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/280,465

(22) Filed: Sep. 29, 2016

(65) Prior Publication Data

US 2017/0094811 A1 Mar. 30, 2017

Related U.S. Application Data

(60) Provisional application No. 62/235,315, filed on Sep. 30, 2015.

(51) Int. Cl.
*H05K 5/00* (2006.01)
*H05K 5/02* (2006.01)
*H01Q 1/22* (2006.01)
*H01Q 1/42* (2006.01)
*H05K 5/06* (2006.01)

(52) U.S. Cl.
CPC ............. *H05K 5/0004* (2013.01); *H01Q 1/22* (2013.01); *H01Q 1/42* (2013.01); *H05K 5/0217* (2013.01); *H05K 5/062* (2013.01)

(58) Field of Classification Search
CPC combination set(s) only.
See application file for complete search history.

(56) References Cited

U.S. PATENT DOCUMENTS 4,567,318 A   1/1986  Shu
6,532,152 B1  3/2003  White et al.
(Continued)

FOREIGN PATENT DOCUMENTS

CN  202540623   11/2012
EP  1225652    7/2002
EP  2838157    2/2015

OTHER PUBLICATIONS

Invitation to Pay Additional Fees, PCT/US2016/054511, 7 pages, Sep. 29, 2016.

*Primary Examiner* — Lisa Lea Edmonds
(74) *Attorney, Agent, or Firm* — Brownstein Hyatt Farber Schreck, LLP

(57) ABSTRACT

A housing for an electronic device that allows electromagnetic waves to pass through the housing is disclosed. The housing may include a first portion having an opening, a second portion positioned within the opening, and an insert including a protrusion extending into at least a portion of a gap formed between the first portion and the second portion. The housing also may include a first ink layer disposed within the gap and substantially surrounding the protrusion, and a second ink layer disposed within the gap and over the first ink. The first portion, second ink layer, and second portion may cooperate to form a substantially contiguous surface, and the second ink layer may be positioned approximately 5 microns (μm) or less below an exposed surface of the first portion and an exposed surface of the second portion.

20 Claims, 13 Drawing Sheets

(56) References Cited

U.S. PATENT DOCUMENTS

| | | | |
|---|---|---|---|
| 6,625,394 B2 * | 9/2003 | Smith | G03B 17/08 |
| | | | 116/213 |
| 7,377,767 B2 | 5/2008 | Dubuis et al. | |
| 7,684,178 B2 * | 3/2010 | Hsu | B29C 45/14811 |
| | | | 361/679.21 |
| 7,713,054 B2 | 5/2010 | Mai | |
| 7,798,804 B2 | 9/2010 | Kmoch et al. | |
| 8,373,980 B2 | 2/2013 | Reber | |
| 8,380,258 B2 | 2/2013 | Kim et al. | |
| 8,506,327 B2 | 8/2013 | Jol | |
| 8,537,543 B2 | 9/2013 | Wang et al. | |
| 8,620,395 B2 | 12/2013 | Kang et al. | |
| 8,654,029 B2 * | 2/2014 | Fan | H01Q 1/40 |
| | | | 29/600 |
| 8,665,160 B2 * | 3/2014 | Uttermann | H01Q 1/243 |
| | | | 343/702 |
| 8,773,847 B2 | 7/2014 | Byun et al. | |
| 8,878,060 B2 | 11/2014 | Wright et al. | |
| 8,884,826 B2 * | 11/2014 | Wu | H01Q 1/243 |
| | | | 343/702 |
| 8,980,026 B2 | 3/2015 | Ely | |
| 9,075,567 B2 | 7/2015 | Mathew et al. | |
| 9,223,349 B2 | 12/2015 | Franklin et al. | |
| 9,229,675 B2 | 1/2016 | Beeze et al. | |
| 9,338,909 B2 | 5/2016 | Tanaka | |
| 9,360,889 B2 | 6/2016 | Idsinga et al. | |
| 9,469,469 B2 | 10/2016 | Rayner | |
| 9,516,150 B2 | 12/2016 | Jeon et al. | |
| 9,520,638 B2 | 12/2016 | Baringer et al. | |
| 9,578,145 B2 | 2/2017 | Chang | |
| 9,791,893 B2 | 10/2017 | Yamaguchi et al. | |
| 9,795,044 B2 | 10/2017 | Lai et al. | |
| 2008/0268083 A1 | 10/2008 | Ferenc | |
| 2010/0230155 A1 * | 9/2010 | Hashizume | B29C 45/14639 |
| | | | 174/521 |
| 2012/0319907 A1 * | 12/2012 | Wu | G06F 1/1698 |
| | | | 343/702 |
| 2013/0235538 A1 | 9/2013 | Hashimoto et al. | |
| 2014/0206420 A1 | 7/2014 | Neichi | |
| 2014/0334077 A1 | 11/2014 | Kwong | |
| 2015/0093527 A1 * | 4/2015 | Montevirgen | B29C 45/14467 |
| | | | 428/35.7 |
| 2017/0205847 A1 | 7/2017 | Wagman et al. | |

* cited by examiner

MULTI-PART ELECTRONIC DEVICE HOUSING HAVING CONTIGUOUS FILLED SURFACE

CROSS-REFERENCE TO RELATED APPLICATION(S)

This application is a nonprovisional patent application of U.S. Provisional Patent Application No. 62/235,315, filed Sep. 30, 2015 and titled "Multi-Part Electronic Device Housing Having Contiguous Filled Surface," the disclosure of which is hereby incorporated by reference herein in its entirety.

FIELD

The disclosure relates generally to electronic devices and more particularly to a housing for an electronic device that allows electromagnetic waves to pass through the housing.

BACKGROUND

Conventional electronic devices typically include various communication components that are capable of providing and/or receiving data from other electronic devices. For example, most electronic devices include an antenna that is utilized to send and/or receive data for the electronic device wirelessly. The antenna is typically embedded or positioned within the enclosure or housing of the electronic device to prevent the antenna from being damaged and incapable of sending or receiving data for the electronic device. However, the enclosures or housings for the electronic devices are typically solid (e.g., formed from a single piece) to improve strength for the electronic device, to house and protect the internal components of the electronic device and/or to prevent contaminants (e.g., dust, water and other particles) from entering the housing and damaging the internal components of the electronic device. The solid enclosure and/or housing can negatively impact the operation of the antenna of the electronic device by making it difficult for the electromagnetic waves of the antenna to pass through the housing when sending and/or receiving data.

As such, enclosures and/or housings can include breaks or openings to improve the transmission of the electromagnetic waves for the antenna through the housing. However, forming breaks or openings in the housing makes the electronic device and its internal component more susceptible to damage (e.g., ingress for contaminants, weakened component). Additionally, where a distinct component (e.g., door, plug) is positioned within the break or opening, the gap formed therebetween can grow and/or vary in size over the operational life of the electronic device as a result of the coupling between the distinct component and the remainder of the enclosure or housing wearing and/or failing.

SUMMARY

A housing for an electronic device is disclosed. The housing comprises: a first portion comprising an opening; a second portion positioned within the opening; a protrusion extending into a gap formed between the first portion and the second portion; a first ink layer disposed within the gap and substantially surrounding the protrusion; and a second ink layer disposed within the gap and over the first ink layer; wherein the first portion, second ink layer, and second portion cooperate to form a substantially contiguous surface; and the second ink layer is positioned approximately 5 microns (μm) or less below an exposed surface of the first portion and an exposed surface of the second portion.

A method for forming a housing for an electronic device is disclosed. The method comprises coupling an insert to a first portion and a second portion of the housing, extending a protrusion of the insert within a gap between the first portion and second portion; disposing a first ink layer within the gap; curing the first ink layer; disposing a second ink layer within the gap and over the first ink layer, an exposed surface of the first portion, and an exposed surface of the second portion; smoothing at least part of the second ink layer; and curing the second ink layer; wherein a top surface of the second ink layer is within 10 microns of a top surface of the second portion of the housing.

An electronic device is disclosed. The electronic device comprises a housing including a body comprising an opening formed in an end of the housing, and an antenna window positioned within the opening of the body. The antenna window is separated from the body via a gap. The electronic device also comprises a plastic insert coupled to the housing and the antenna window. The insert comprises a protrusion extending into a portion of the gap between the housing and the antenna window. Additionally, the electronic device comprises at least one ink layer disposed within the gap. The at least one ink layer is exposed between the housing and the antenna window.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
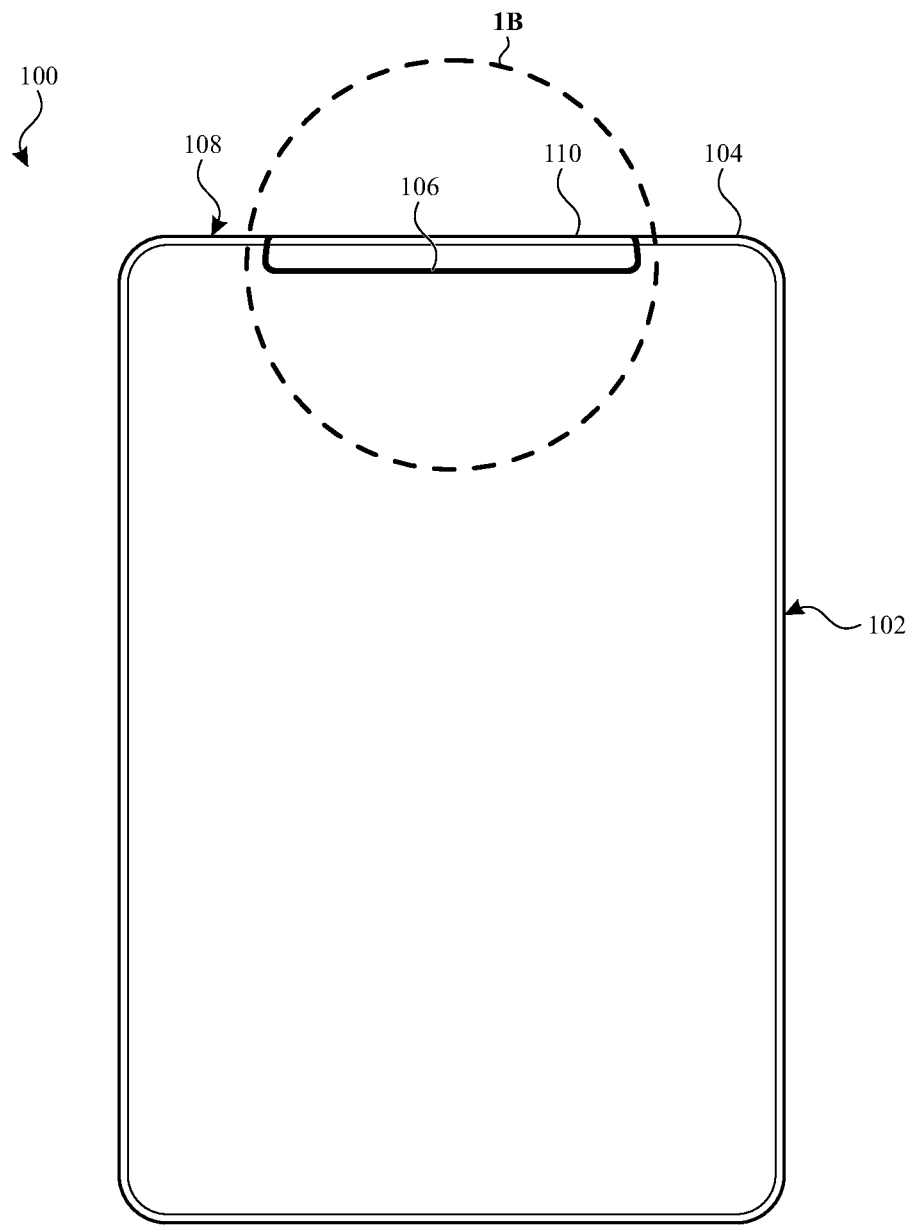
FIG. 1A shows a back view of an electronic device including a housing formed from a body portion and an antenna window.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to electronic devices and more particularly to a housing for an electronic device that allows electromagnetic waves to pass through the housing.

In a particular embodiment, a housing for an electronic device is configured to allow electromagnetic waves from an antenna of the electronic device (or other electronic component) to pass through the housing without substantial attenuation or being blocked. The housing includes two distinct portions that are separated by a gap. The gap formed between the first portion and the second portion is sized to allow electromagnetic waves from the antenna to pass through the housing, between the two distinct portions. The gap may be filled by a filler or multiple fillers, which may (or may not) be transparent to antenna frequencies. In some embodiments, an ink, resin, latex, or other suitable material may form a top surface of the filler or fillers such that the top surface is flush or near-flush with the two distinct portions.

Components of the housing (e.g., the fillers) are positioned and/or disposed in the gap to provide structure to the housing, prevent the size of the gap from varying over the operational life of the electronic device, and provide a surface between the two portions of the housing that feels contiguous to a user of the housing. In certain embodiments, the user may not be able to tactilely perceive difference in depth and/or height between the housing components and a top surface of a filler in the gap. Further, in some embodiments the fillers improve the appearance of the housing, including the gap.

In the particular embodiment, an insert can be coupled to the two portions of the housing for securing the portions to one another and setting the size of the gap formed therebetween. Additionally, a protrusion of the insert can be positioned within the gap to provide additional support and rigidity to the separate portions of the housing. At least one layer of ink can also be disposed within the gap over the protrusion of the insert and can seal the gap between the two portions of the housing. The ink disposed in the gap can be formed such that the surface of the ink is contiguous with or positioned below the surface of the housing by a small distance (e.g., less than approximately 5 microns (μm), 10 microns (μm), or the like), such that the ink in the gap creates a transition between the two portions of the housing that feels contiguous and/or lacks discontinuities that are tactilely and/or visually perceptible. As such, although the housing is formed from two distinct portions, the ink disposed in the gap makes the transition from and/or over the surface of the housing between the two portions tactilely and/or visually imperceptible to a person; in some embodiments, the housing feels continuous, smooth and/or uniform.

These and other embodiments are discussed below with reference to FIGS. 1A-6B. However, those skilled in the art will readily appreciate that the detailed description given herein with respect to these Figures is for explanatory purposes only and should not be construed as limiting.

FIG. 1A shows an electronic device including a housing according to embodiments. The electronic device 100 shown in FIG. 1A includes an antenna (not shown) positioned within the housing 102 for transmitting and receiving electromagnetic waves to communicate and/or provide electronic information to other electronic devices wirelessly. In order to transmit and receive electromagnetic waves, a break or separation is formed in housing 102 to allow the electromagnetic waves to pass to and/or from the antenna and through housing 102. As discussed below in detail, housing 102 includes two distinct parts or portions that allow the electromagnetic waves to pass through housing 102 without disruption or disturbance. The two distinct portions of housing 102 are separated by a gap that is sized to aid in allowing electromagnetic waves from the antenna of electronic device 100 to pass through housing 102, between the two distinct portions. As discussed herein, components of housing 102 and/or electronic device 100 are positioned and/or disposed within the gap to provide structure to housing 102 and/or prevent the size of the gap from varying during the operational life of electronic device 100. In addition to providing structural support and benefits, and as discussed herein, additional components can be disposed within the gap formed in housing 102 to make housing 102 feel contiguous and/or lack discontinuities that are tactilely and/or visually perceptible when a user touches and/or looks at housing 102 formed from two distinct portions.

As shown in FIG. 1A, housing 102 of electronic device 100 includes a first portion or a main body portion 104 (hereafter, "body 104"). Body 104 of housing 102 includes the majority of the structure or material forming housing 102 for electronic device 100. In a non-limiting example, body 104 of housing 102 includes and/or houses substantially all of the internal components of electronic device 100, including the antenna (not shown) for electronic device 100. Body 104 of housing 102 includes a recess, cutout or opening 106 formed on an end 108 of housing 102. As shown in FIG. 1A, and additionally shown in the enlarged portion of electronic device 100 in FIG. 1B, recess or opening 106 extends into and/or through a substantially small portion of housing 102 at end 108. Additionally, opening 106 is formed in and/or through only a portion of the width of housing 102 at end 108.

Figure 1B:
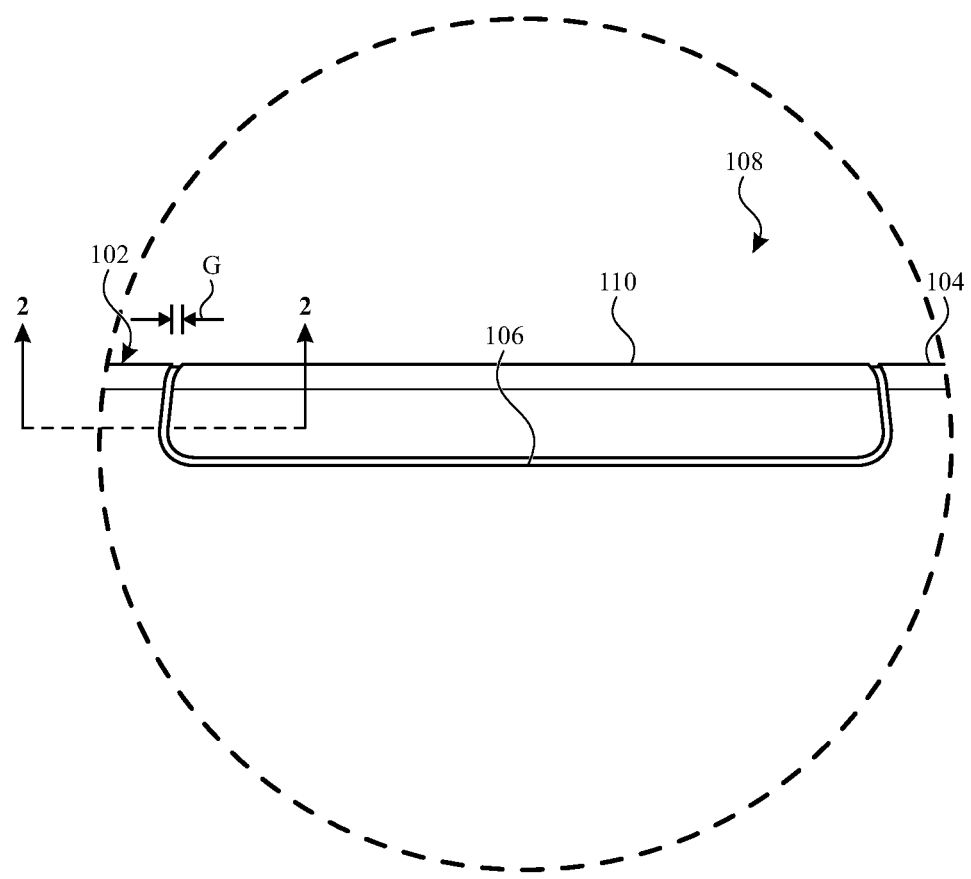
FIG. 1B shows an enlarged view of a portion of the housing formed from the body portion and the antenna window as shown in FIG. 1A.

Housing 102 also includes a second portion or an antenna window 110. As shown in FIGS. 1A and 1B, antenna window 110 is positioned within opening 106 of body 104. That is, antenna window 110 is positioned within opening 106 and is at least partially surrounded by body 104 of housing 102. Antenna window 110 is smaller than opening 106 formed in body 104 at end 108 of housing 102. As such, when antenna window 110 is inserted and/or positioned within opening 106 formed in body 104, a separation or gap (G) exists (see, FIG. 1B) between body 104 and antenna window 110 of housing 102. The separation or gap (G) formed between body 104 and antenna window 110 is sized to allow the antenna of electronic device 100 to transmit and/or receive electromagnetic waves through housing 102 and/or between body 104 and antenna window 110, as discussed herein. The gap is sized by forming opening 106 and/or antenna window 110 to have a predetermined dimension, such that when antenna window 110 is inserted and/or positioned within opening 106, the gap (G) between body 104 and antenna window 110 exists. Additionally as discussed herein, the gap (G) formed between body 104 and antenna window 110 includes additional components formed therein, where the additional components also aid in the formation of the gap (G) between body 104 and antenna window 110 of housing 102.

Housing 102, and the distinct portions forming housing 102, are formed from similar materials or materials having substantially similar properties and characteristics. Specifically, body 104 and antenna window 110 can be formed from similar materials, or alternatively, can be formed from distinct materials. In the non-limiting example where body 104 and antenna window 110 are formed from the same material, body 104 and antenna window 110 can be formed from the same piece of material. That is, a single sheet or piece of material can be formed to take the desired shape of housing 102, and can be subsequently cut to form opening 106 in body 104. The removed or cut portion of the material can undergo further material processing (e.g., grinding, cutting, shaping and so on) to form antenna window 110. Additionally or separately, opening 106 can undergo additional material processing to ensure that antenna window 110 formed from the removed or cut portion of the single piece of material can be positioned within opening 106 and a gap (G) can be formed therebetween. Body 104 and antenna window 110 can be formed from various materials that provide a rigid structure for supporting electronic device 100 and/or protecting the internal components of electronic device 100, such as, but not limited to, metals or metal alloys. In a non-limiting example, both body 104 and antenna window 110 can be formed from aluminum. In another non-limiting example, one of body 104 or antenna window 110 can be formed from aluminum, and the other component (e.g., body 104, antenna window 110) forming housing 102 can be formed from a distinct metal alloy, such as titanium, chromium or steel.

Figure 2:
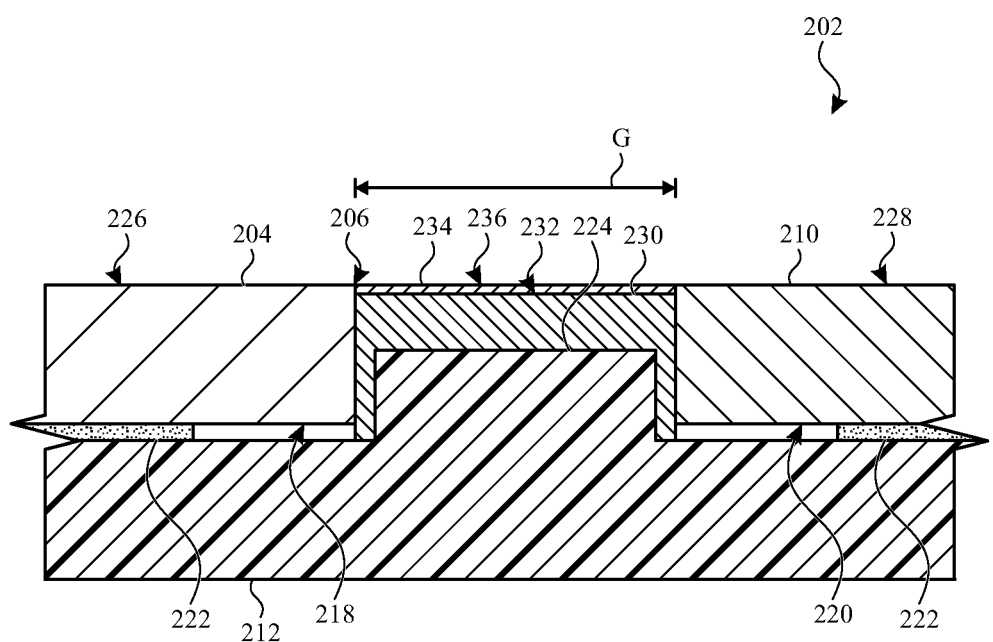
FIG. 2 shows a cross-section view of a portion of the housing formed from the body portion and the antenna window taken along line 2-2 in FIG. 1B.

FIG. 2 shows a cross-section view of housing 202 taken along line 2-2 in FIG. 1B. Specifically, FIG. 2 shows a cross-section of body 204, antenna window 210 and additional components of housing 202. It is understood that similarly numbered and/or named components may function in a substantially similar fashion. Redundant explanation of these components has been omitted for clarity.

As shown in FIG. 2, housing 202 includes an insert 212. Insert 212 is positioned below, adjacent and/or between body 204 and antenna window 210 of housing 202. Additionally, insert 212 is coupled or affixed to body 204 and antenna window 210 of housing 202. Specifically, and as shown in FIG. 2, insert 212 is coupled to an interior surface 218 of body 204 and an interior surface 220 of antenna window 210, respectively. In a non-limiting example, insert 212 is adhered to interior surface 218 of body 204 and interior surface 220 of antenna window 210, respectively, using adhesive 222. In addition to adhering and/or coupling insert 212 to body 204 and antenna window 210, respectively, adhesive 222 can also be configured to seal the gap (G) formed between body 204 and antenna window 210. The sealing of the gap (G) can prevent contaminants (e.g., water, dust and other damaging particles) from entering housing 202. It is understood that insert 212 can be coupled to body 204 and antenna window 210 using other coupling mechanisms and/or techniques as well. In non-limiting examples, insert 212 can be coupled to body 204 and antenna window 210 using tape, solder, fasteners (e.g., screws, snap-fits, and so on) and the like.

In addition to adhering insert 212 to body 204 and antenna 210, adhesive 222 can also act as a shim within housing 202. Specifically, the thickness and/or amount of adhesive 222 positioned between insert 212 and body 204/antenna window 210 can create an "offset" and/or a space between insert 212 and body 204/antenna window 210. This offset can alter size, and specifically the depth, of the gap (G) formed between body 204 and antenna window 210. As discussed herein, the depth of the gap (G) formed in housing 202 impacts and/or influences a thickness and/or an amount of ink(s) that can be disposed within the gap (G). Although adhesive 222 is discussed as creating the offset between insert 212 and body 204/antenna window 210, it is understood that any coupling component formed between insert 212 and body 204/antenna window 210 for coupling the components can create and/or influence the offset.

Insert 212 also includes a protrusion 224. Protrusion 224 extends from the portion of insert 212 positioned below and/or coupled to body 204 and antenna window 210. Additionally, protrusion 224 extends between body 204 and antenna window 210, and/or is positioned within a portion of the gap (G) formed between body 204 and antenna window 210. As shown in FIG. 2, the positioning of protrusion 224 between body 204 and antenna window 210 impacts and/or influences the size of the gap (G) formed between body 204 and antenna window 210. Specifically, the gap (G) formed between body 204 and antenna window 210 can be no smaller than protrusion 224 of insert 212. As a result, protrusion 224 may include a width and/or size that may correspond to the minimum size required for the gap (G) to allow electromagnetic waves from the antenna (not shown) of an electronic device (see, FIG. 1A) to pass through housing 202 and/or between body 204 and antenna window 210, as discussed herein.

Additionally as shown in FIG. 2, protrusion 224 is positioned below an exposed surface 226 of body 204 and an exposed surface 228 of antenna window 210. That is, protrusion 224 of insert 212 is positioned below exposed surface 226 of body 204 and exposed surface 228 of antenna window 210, such that protrusion 224 is not visible in housing 202. In a non-limiting example, protrusion 224 of insert 212 can be positioned below exposed surface 226 of body 204 and exposed surface 228 of antenna window 210 at a distance between approximately 50 microns (μm) and approximately 200 μm, and/or 5 to 100 microns in particular embodiments. As discussed herein, additional components of housing 202 are positioned within the gap (G) between body 204 and antenna window 210 and/or are disposed over protrusion 224. In some embodiments, the distance between the protrusion's top surface and the exposed surface(s) may set a total depth of one or more ink layers or other fillers.

As shown in FIG. 2, insert 212 including protrusion 224 is formed as a single, integral component or structure. However, it is understood that protrusion 224 can be formed from a distinct piece or component and can be coupled to insert 212 using any of the coupling mechanisms and/or coupling techniques discussed herein. Additionally, insert 212 including protrusion 224 can be formed from a substantially rigid component than can hold body 204 and antenna window 210 in place within housing 202. In a non-limiting example, insert 212 can be formed from a polymer, such as plastic.

Housing 202, as shown in FIG. 2, can also include filler(s) such as a first ink layer 230 disposed within the gap (G) formed between body 204 and antenna window 210. Additionally, first ink layer 230 is disposed within the gap (G) and substantially surrounds, covers, and/or masks protrusion 224 of insert 212. As shown in FIG. 2, portions of first ink layer 230 are disposed around protrusion 224 of insert 212 and are positioned between body 204 and protrusion 224, and antenna window 210 and protrusion 224, respectively. As such, first ink layer 230 can be formed between body 204 and protrusion 224, and antenna window 210 and protrusion 224, respectively, to ensure the gap (G) formed between body 204 and antenna window 210 is adequately sized to allow electromagnetic waves to be transmitted through housing 202 and/or the gap (G). Additionally, first ink layer 230 can also be formed or disposed between body 204 and protrusion 224, and antenna window 210 and protrusion 224, respectively, to seal the gap (G) of housing 202.

Additionally as shown in FIG. 2, first ink layer 230 is positioned below portions of body 204 and antenna window 210, respectively. Specifically, a surface 232 of first ink layer 230 disposed in the gap (G) formed between body 204 and antenna window 210 is positioned below exposed surface 226 of body 204 and exposed surface 228 of antenna window 210, respectively. In some embodiments, surface 232 of first ink layer 230 is formed below exposed surface 226 of body 204 and exposed surface 228 of antenna window 210, respectively, to make additional room within the gap (G) formed between body 204 and antenna window 210 for a second ink layer, although this is not necessary or contemplated in all embodiments. Other embodiments may form the surface 232 at or even above the exposed surfaces 226, 228.

First ink layer 230 is formed from a first curable colored ink. The color of the ink forming first ink layer 230 is dependent on, at least in part, the color of body 204 and antenna window 210. Additionally, the amount of the first curable colored ink forming the first ink layer 230 that is disposed over protrusion 224 is dependent upon the color of the ink. That is, the thickness and/or the amount of curable colored ink disposed within the gap (G) is dependent upon the color of the curable colored ink forming the first ink layer 230 and/or the desired color to be perceived through a second ink layer, as discussed herein. In a non-limiting example, the thickness and/or amount of a curable colored ink forming a black first ink layer 230 can be substantially less than a thickness and/or amount of a curable colored ink forming a light gray first ink layer 230. The thickness and/or amount of the black ink can be smaller because the black ink is more opaque, and therefore is more true to color and/or requires less color to achieve a desired color (e.g., black) visible and/or perceived in the gap (G) formed in housing 202.

Additionally, by disposing first ink layer 230 formed from colored ink within the gap (G), the visible color of the ink disposed in the gap (G) can be constant, uniform and/or include less variation for housing 202. That is, because the visible color of the gap (G) formed within housing 202 is directly dependent upon the colored ink forming first ink layer 230 disposed between body 204 and antenna window 210, the quality and/or consistency of the visible color can be controlled by the amount of ink disposed within the gap (G). In non-limiting examples, the intensity, the consistency/uniformity and/or the variation of the visible color of first ink layer 230 disposed and visible in gap (G) of housing 202 can be improved by altering the amount and/or thickness of first ink layer 230.

Housing 202 can also include second ink layer 234 and, in some embodiments, additional ink layers beyond the second. As shown in FIG. 2, second ink layer 234 is disposed and/or formed within the gap (G) formed between body 204 and antenna window 210, and is formed over and/or surrounding first ink layer 230. Specifically, second ink layer 234 is disposed, formed directly over and/or substantially covers surface 232 of first ink layer 230. As similarly discussed herein with respect to first ink layer 230, second ink layer 234 disposed within the gap (G) formed between body 204 and antenna window 210 can substantially seal the gap (G) formed between body 204 and antenna window 210.

As shown in FIG. 2, second ink layer 234 includes an exposed surface 236, opposite surface 232 of first ink layer 230, that is positioned in substantially planar alignment with exposed surface 226 of body 204 and exposed surface 228 of antenna window 210, respectively. In this non-limiting example, second ink layer 234 formed in gap (G) provides a relatively uniform transition between body 204 and antenna window 210 of housing 202. As one example, because exposed surface 236 (e.g., a top surface of the fillers) is contiguous with exposed surface 226 of body 204 and exposed surface 228 of antenna window 210, the transition across second ink layer 234 from body 204 to antenna window 210 feels contiguous and/or lacks discontinuities that are typically associated with multi-part structures. Thus, the transition(s) may be tactilely and/or visually imperceptible.

In another non-limiting example, discussed below in detail, exposed surface 236 of second ink layer 234 can be positioned at substantially the same level as, or slightly below, exposed surface 226 of body 204 and exposed surface 228 of antenna window 210, respectively. In the non-limiting example, and as discussed in detail below, exposed surface 236 of second ink layer 234 can be positioned below exposed surface 226 of body 204 and exposed surface 228 of antenna window 210 at a relatively small distance. In some embodiments, this distance is less than approximately 5 microns, while in others it may be less than approximately 10 microns. As a result, second ink layer 234 disposed in the gap (G) creates a transition between body 204 and antenna window 210 that is tactilely and/or visually imperceptible for a user of housing 202. It should be appreciated that tactile imperceptibility may not be a feature of all embodiments.

Second ink layer 234 is formed from a second curable ink. Unlike the first curable colored ink forming first ink layer 230, the second curable ink forming second ink layer 234 is substantially clear and/or transparent. That is, the second curable ink forming second ink layer 234 is formed to have substantially transparent and/or clear properties. As a result of the transparent or clear properties of the second curable ink forming second ink layer 234, the first curable colored ink forming first ink layer 230 is visible within the gap (G) through second ink layer 234.

Additionally, the thickness and/or amount of the second curable ink forming second ink layer 234 that is disposed over first ink layer 230 is dependent upon the thickness and/or amount of first ink layer 230 disposed in the gap (G). That is, the thickness and/or the amount of second curable ink disposed within the gap (G) is dependent upon the thickness and/or amount of first ink layer 230 disposed in the gap (G) and the amount of space in the gap that is unoccupied by protrusion 224 and first ink layer 230. Additionally, the thickness and/or amount of the second curable ink forming second ink layer 234 that is disposed within the gap (G) is dependent on, at least in part, the finish and/or texture to be achieved on exposed surface 236 of second ink layer 234. That is, the second curable ink forming second ink layer 234 can provide a texture and/or a finish (e.g., gloss, matte, and so on) within the gap (G) formed between body 204 and antenna window 210 of housing 202. In a non-limiting example, the thinner and/or smaller amount of second ink layer 234 disposed in the gap (G), the less glossy second ink layer 234 and first ink layer 230 will appear in the gap (G). As discussed herein, second ink layer 234 can also act as a protective layer for colored, first ink layer 230 to prevent first ink layer 230 from being removed from the gap (G) and/or prevent the gap (G) from becoming colorless or discontinuous in color.

The first curable ink forming first ink layer 230 and the second curable ink forming second ink layer 234 can include similar, unique features that aid in the formation of housing 202, as discussed herein. In a non-limiting example, both the first curable ink forming first ink layer 230 and the second curable ink forming second ink layer 234 can be formed from a material that does not shrink and/or includes low shrinkage during the curing process for each layer. As discussed herein, the non-shrinkage and/or low shrinkage of first ink layer 230 and second ink layer 234 aids in maintaining a uniform and planar transition over the gap (G) between body 204 and antenna window 210.

Additionally in another non-limiting example, and as discussed herein, both first curable ink forming first ink layer 230 and the second curable ink forming second ink layer 234 can be chemically, materially and/or compositionally configured to bond to other curable ink and insert 212 of housing 202. Specifically, first curable ink forming first ink layer 230 and the second curable ink forming second ink layer 234 are compositionally configured to bond to other curable ink and insert 212 formed from plastic when each of first ink layer 230 and second ink layer 234 are cured. In addition, first curable ink forming first ink layer 230 and second curable ink forming second ink layer 234 can be chemically, materially and/or compositionally configured to prevent, resist and/or minimize a bond with body 204 and antenna window 210 of housing 202. As discussed herein, the prevention and/or minimization of the bond formed between first ink layer 230 and second ink layer 234 with body 204 and antenna window 210 allows for easier removal of second ink layer 234 that can be disposed over exposed surface 226 of body 204 and/or exposed surface 228 of antenna window 210, when forming housing 202.

Figure 3:
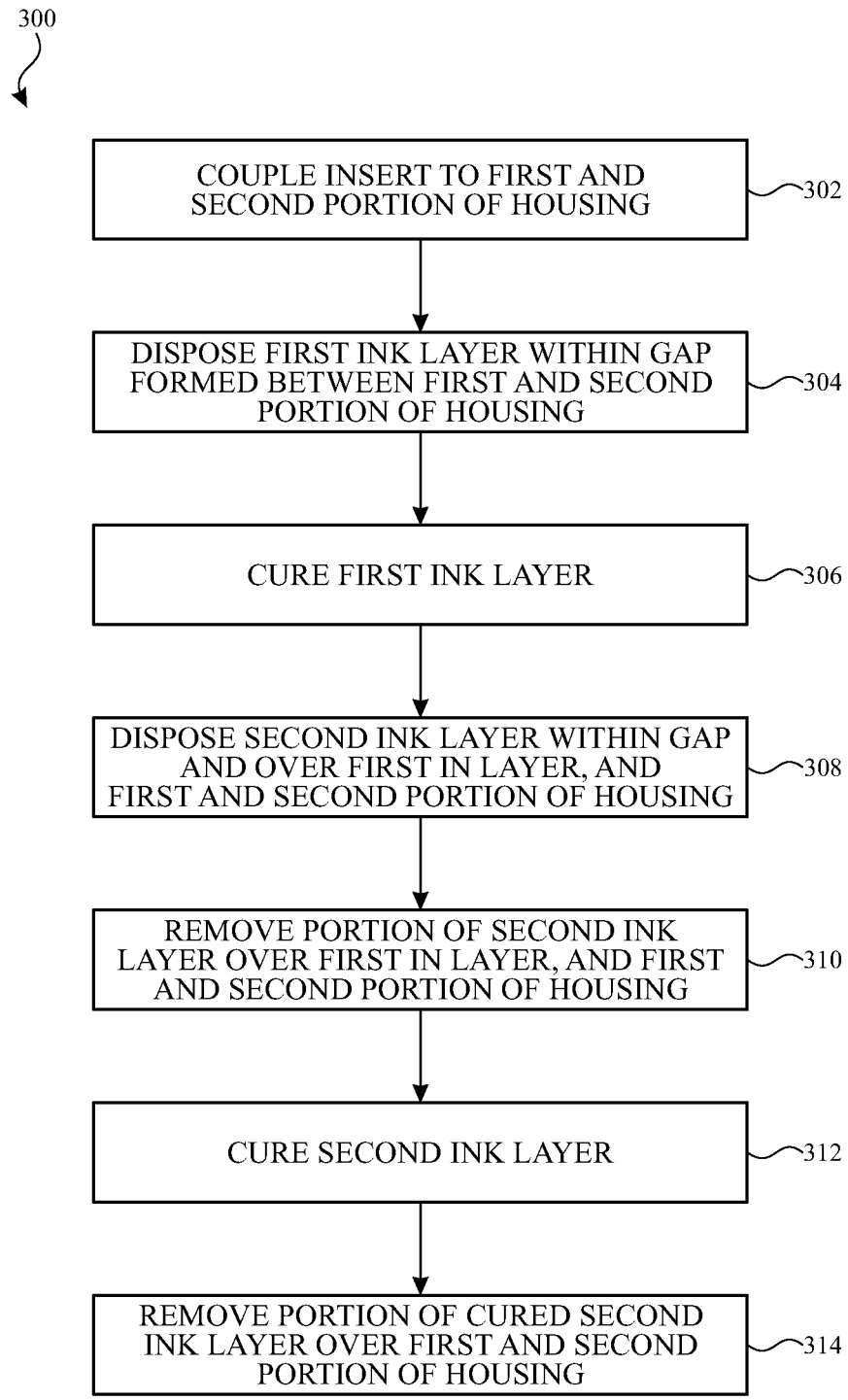
FIG. 3 shows a flow chart of an example process for forming a housing for an electronic device.

FIG. 3 depicts an example process for forming a housing for electronic devices. Specifically, FIG. 3 is a flowchart depicting one example process 300 for forming a housing for an electronic device that allows electromagnetic waves from an antenna of the electronic device to pass through the housing. In some cases, the housing is formed for an electronic device discussed below with respect to FIGS. 6A and 6B.

In operation 302, an insert is coupled to a first portion or body of a housing and a second portion or antenna window of the housing. The insert is coupled to the body and antenna window, respectively, by adhering the insert to each component of the housing. Specifically, the insert is adhered to an interior surface of the body and adhered to an interior surface of the antenna window, respectively. The interior surface of the body is positioned opposite an exposed surface of the body, and the interior surface of the antenna window is positioned opposite an exposed surface of the antenna window. Coupling the insert to the body and antenna window also includes positioning a protrusion of the insert within at least a portion of a gap formed between the body and the antenna window. The gap formed between the body and the antenna window is sized to allow electromagnetic waves from an antenna to pass through the housing and/or between the body and the antenna window.

In operation 304, a first ink layer is disposed within the gap formed between the body and the antenna window of the housing. The first ink layer is disposed in a portion of the gap formed between the body and the antenna window, and the first ink layer substantially covers the protrusion of the insert positioned in a portion of the gap formed between the body and the antenna window. In addition, disposing the first ink layer within a portion of the gap can include disposing a portion of the first ink layer between the protrusion of the insert and the body and/or the antenna window. Additionally, disposing the first ink layer within the gap can also include forming a surface of the first ink layer below the exposed surface of the body and the exposed surface of the antenna window. The first ink layer is disposed within the gap formed between the body and the antenna window using any suitable technique including, but not limited to, material injection using a needle or syringe, jetting material, digital printing and/or precision spraying. The first ink layer disposed in the gap includes a curable, colored ink.

In operation 306, the first ink layer is cured. Specifically, after the first ink layer is disposed within the gap formed between the body and the antenna (e.g., operation 304), the first ink layer undergoes a curing process(es). Curing the first ink layer in operation 306 may also result in the first ink layer shrinking. That is, as a result of performing the curing process on the first ink layer, the first ink layer can shrink in size. However, the chemical and/or material composition of the curable, colored ink forming the first ink layer can be a low and/or minimal shrinkage material. As such, the shrinking of the first ink layer that occurs during the curing process can be substantially minimal and/or negligible. Additionally, curing the first ink layer can include bonding the first ink layer to the protrusion of the insert. That is, as the first ink layer is cured, the first ink layer is also bonded to the protrusion of the insert which the first ink layer substantially covers.

In operation 308, a second ink layer is disposed within the gap formed between the body and the antenna window of the housing. Additionally, the second ink layer is over-disposed and/or printed outside of the gap and onto a portion of the body and the antenna window. As such, the second ink layer is disposed over the first ink layer disposed within the gap, a portion of the exposed surface of the body and a portion of the exposed surface of the antenna window. Additionally, disposing the second ink layer also includes temporarily forming an exposed surface of the second ink layer above and/or onto the exposed surface of the body and the exposed surface of the antenna window. Similar to the first ink layer, the second ink layer is disposed in operation 308 using any suitable technique including, but not limited to, material injection using a needle or syringe, jetting material, digital printing and/or precision spraying. The second ink layer includes and/or is formed from a curable, clear or transparent ink.

In operation 310, at least a part of the second ink layer is removed. Specifically, at least a part of the second ink layer disposed over the first ink layer, the exposed surface of the body and/or the exposed surface of the antenna window is removed. The removal process in operation 310 includes scraping at least a part of the uncured second ink layer from the exposed surface of the body and the exposed surface of the antenna window. The second ink layer is removed or scraped from the housing using an ink removal tool. The ink removal tool includes any suitable tool configured to remove the uncured ink forming the second ink layer including, but not limited to, a blade, a scraper, a flexible removal tool, or the like.

In operation 312, the second ink layer is cured. Specifically, after at least a part of the second ink layer is removed in operation 310, the second ink layer undergoes a curing process(es). Similar to the first ink layer discussed herein with respect to operation 306, curing the second ink layer may result in the second ink layer shrinking. However, the chemical and/or material composition of the curable, clear ink forming the second ink layer can be a low and/or minimal shrinkage material, and the second ink layer may only shrink a substantially minimal and/or negligible amount when cured.

Additionally, curing the second ink layer can include bonding the second ink layer to the first ink layer formed or disposed within the gap formed between the body and the antenna window of the housing. Curing the second ink layer can also include substantially preventing a bond from forming between the second ink layer and the exposed surface of the body and/or the exposed surface of the antenna window. Specifically, when the second ink layer is cured, the parts of the second ink layer that remain on the body and the antenna window and/or are not removed in operation 310 are prevented from bonding to the exposed surface of the body and/or the antenna window. The bonding to the first ink layer and the prevention of a bond forming on the exposed surfaces of the body and/or antenna window, respectively, is a result of the chemical and/or material composition of the curable clear ink forming the second ink layer and the material forming the first ink layer, the body and the antenna window.

In operation 314, any remaining part of the second ink layer disposed anywhere but within the gap is removed. That is, the remaining parts of the second ink layer disposed over the exposed surface of the body and the exposed surface of the antenna window are removed. By removing these remaining parts, the second ink layer is only disposed and/or positioned within the gap formed between the body and the antenna window. The removal of the remaining parts of the second ink layer in operation 314 includes exposing the remaining part of the cured second ink layer to a solvent (e.g., isopropyl alcohol), and wiping away, smoothing, and/or removing the remaining part of the cured second ink layer dissolved by the solvent.

FIGS. 4A-4L show body 404 and antenna window 410 undergoing the process 300 for forming housing 402 as shown and discussed herein with respect to FIG. 3. Specifically, FIGS. 4A-4L show front and cross-section end views of the various components forming housing 402 undergoing the process 300 discussed herein. The various components shown in FIGS. 4A-4L are substantially similar to those shown and discussed herein with respect to FIGS. 1A-2. It is understood that similarly numbered and/or named components may function in a substantially similar fashion. Redundant explanation of these components has been omitted for clarity.

Figure 4A:
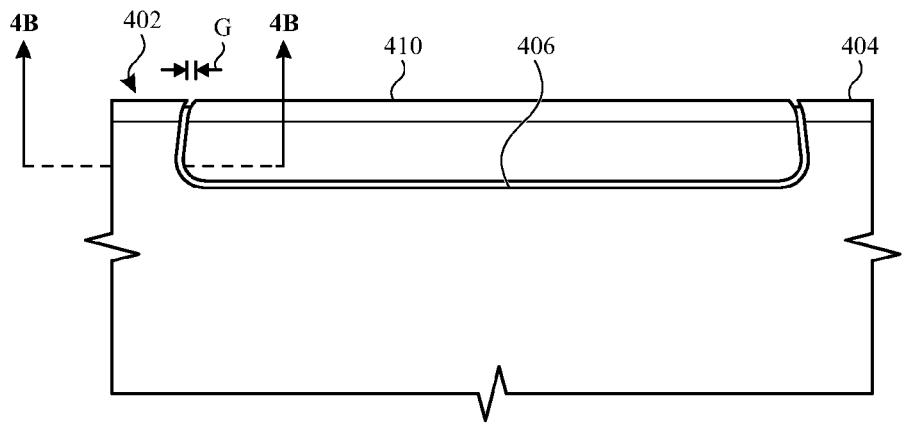
FIG. 4A shows an enlarged view of a portion of a housing for an electronic device formed from a body portion and an antenna window.
Figure 4B:
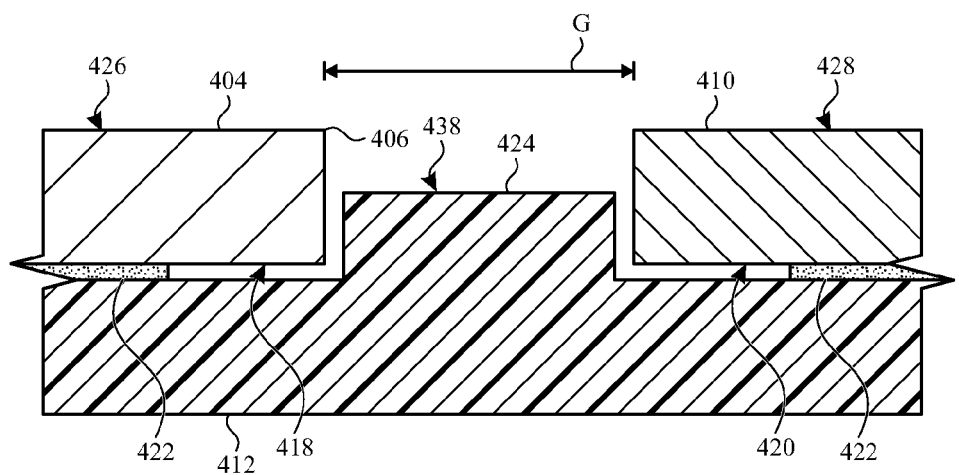
FIG. 4B shows a cross-section view of a portion of the housing formed from the body portion and the antenna window taken along line 4B-4B in FIG. 4A.

FIG. 4A shows a front view of a portion of body 404 and antenna window 410 according to embodiments. Additionally, FIG. 4B shows a cross-section view of body 404 and antenna window 410 of FIG. 4A, taken along line 4B-4B. As shown in FIGS. 4A and 4B, antenna window 410 is positioned within opening 406 formed in body 404 such that a gap (G) is formed between body 404 and antenna window 410. As discussed herein, the gap (G) is formed to allow electromagnetic waves to pass through housing 402 and/or between body 404 and antenna window 410.

Additionally shown in FIG. 4B, insert 412 is coupled and/or adhered to body 404 and antenna window 410, respectively. Specifically, insert 412 is adhered to interior surface 418 of body 404 and interior surface 420 of antenna window 410 using adhesive 422. As a result of coupling and/or adhering insert 412 to body 404 and antenna window 410, protrusion 424 of insert 412 is positioned within a portion of the gap (G) formed between body 404 and antenna window 410. As shown in FIG. 4B, when insert 412 is coupled to body 404 and antenna window 410, a surface 438 of protrusion 424 is positioned within the gap (G) and below exposed surface 426 of body 404 and exposed surface 428 of antenna window 410, respectively.

The process performed on body 404 and antenna window 410 as shown and discussed herein with respect to FIGS. 4A and 4B corresponds to operation 302 of the process 300 shown in FIG. 3.

Figure 4C:
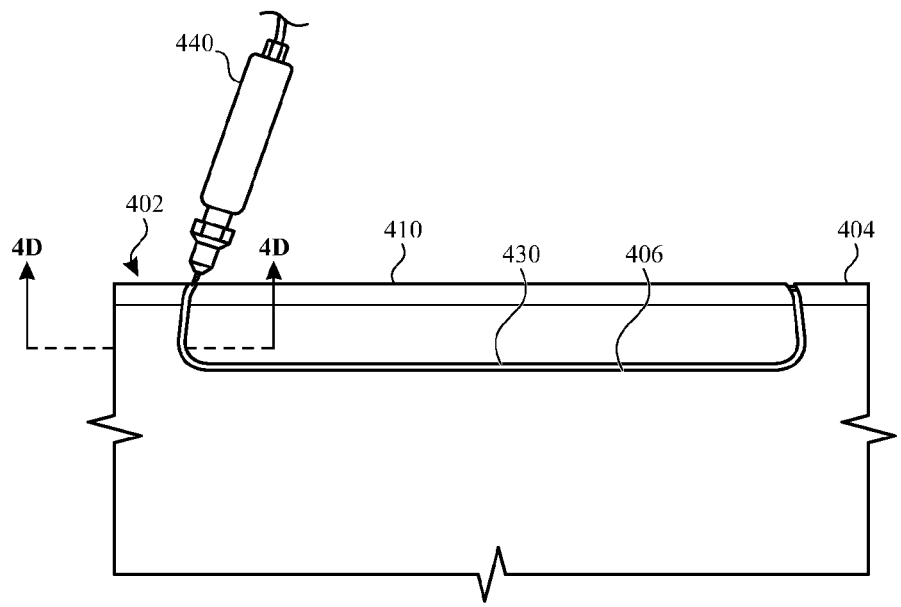
FIG. 4C shows an enlarged view of the portion of the housing of FIG. 4A after a first ink layer is applied in a gap.
Figure 4D:
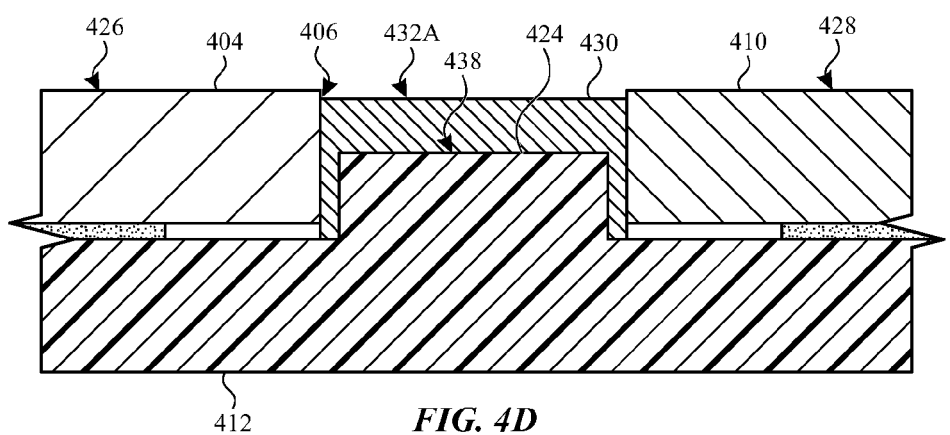
FIG. 4D shows a cross-section view of a portion of the housing of FIG. 4C taken along line 4D-4D.

FIGS. 4C and 4D show first ink layer 430 being disposed, provided and/or formed in the gap (G) (see, FIGS. 4A and 4B). Specifically, first ink layer 430 is disposed into the gap (G) formed between body 404 and antenna window 410, and is disposed over protrusion 424 including surface 438 (see, FIG. 4D). As shown in FIG. 4C, first ink layer 430 is disposed within the gap (G) using an ink dispensing component 440. In a non-limiting example, ink dispensing component 440 is configured as a material injection component using a needle or syringe for disposing first ink layer 430 within the gap (G). In other non-limiting examples, ink dispensing component 440 can include a material jetting component or system, a digital material printing system and/or precision spraying component, all configured to dispose first ink layer 430 within the gap (G) formed between body 404 and antenna window 410. As discussed herein with respect to FIG. 2, first ink layer 430 is formed from a curable, colored ink that includes unique properties, as discussed herein.

As shown in FIG. 4D, first ink layer 430 is disposed within the gap (G) (see, FIG. 4B) and substantially surrounds protrusion 424 of insert 412. Additionally, first ink layer 430 includes a surface 432A, corresponding to the surface of first ink layer 430 prior to performing a curing process for first ink layer 430. As shown in FIG. 4D, surface 432A is positioned below exposed surface 426 of body 404 and exposed surface 428 of antenna window 410, respectively. As such, unoccupied or unfilled space within the gap (G) exists between surface 432A of first ink layer 430 and the exposed surfaces 426, 428 of body 404 and antenna window 410, respectively.

Figure 4E:
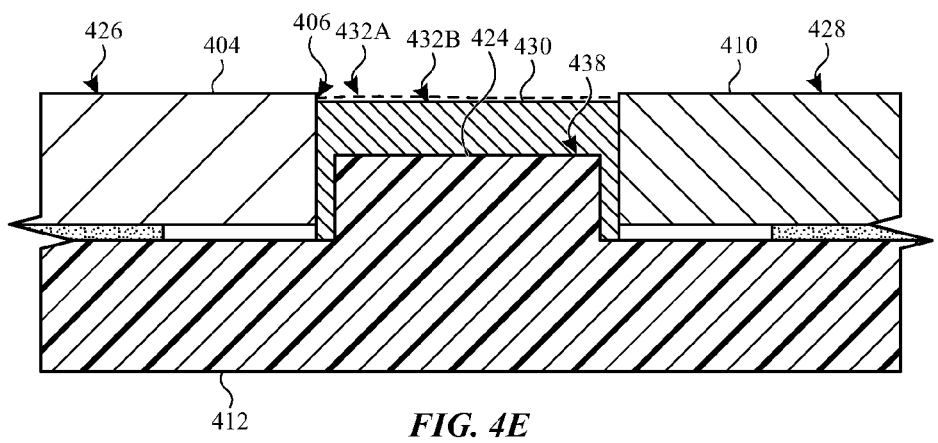
FIG. 4E shows a cross-section view of a portion of the housing of FIG. 4C taken along line 4D-4D subsequent to the first ink layer being cured.

Turning to FIG. 4E, and with comparison to FIG. 4D, first ink layer 430 is shown after or subsequent to performing a curing process. That is, FIG. 4E shows first ink layer 430 after the curable, colored ink forming first ink layer 430 undergoes a curing process. As shown in FIG. 4E, and with comparison to FIG. 4D, curing first ink layer 430 results in the shrinkage (and/or other thickness reduction) of first ink layer 430 and the curable, colored material forming first ink layer 430. The post-cured surface 432B of first ink layer 430 is positioned below the pre-cured surface 432A of first ink layer 430, as discussed herein. The curing process performed on first ink layer 430 can include, but is not limited to, a thermal curing process or an ultraviolet (UV) curing process, and is dependent upon the type of curable ink forming first ink layer 430.

Additionally as a result of performing the curing process, first ink layer 430 is bonded to protrusion 424. Specifically, first ink layer 430 is bonded to surface 438 of protrusion 424 and the other portions of protrusion 424 which first ink layer 430 contacts. First ink layer 430 is bonded to protrusion 424 as a result of curing first ink layer 430, the material composition of the curable, colored ink of first ink layer 430 and/or the material composition of protrusion 424 of insert 412.

The process performed on body 404 and antenna window 410 as shown and discussed herein with respect to FIGS. 4C-4E corresponds to operations 304 and 306 of the process 300 shown in FIG. 3.

Figure 4F:
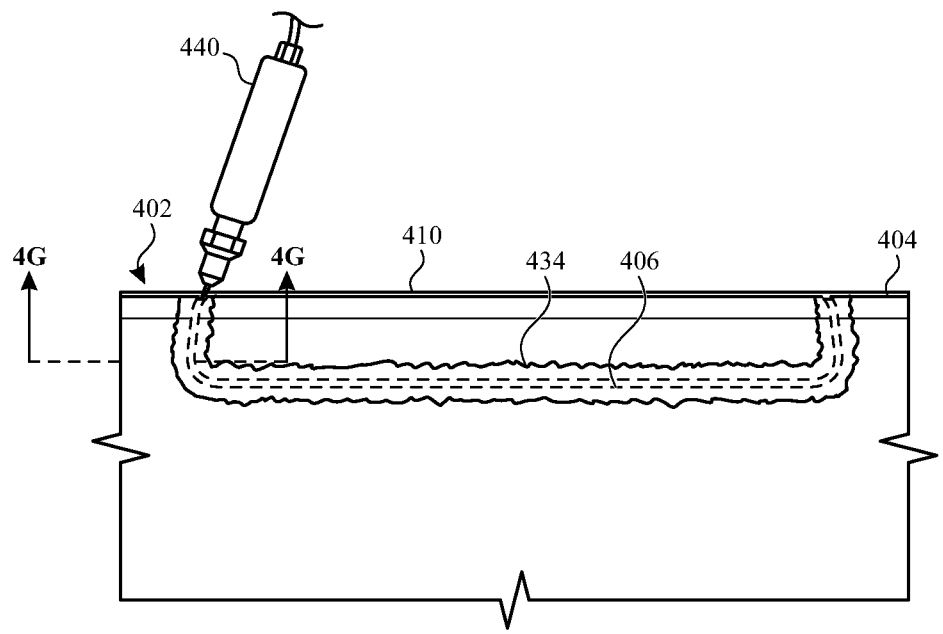
FIG. 4F shows an enlarged view of the portion of the housing of FIG. 4C after a second ink layer is applied to the housing.
Figure 4G:
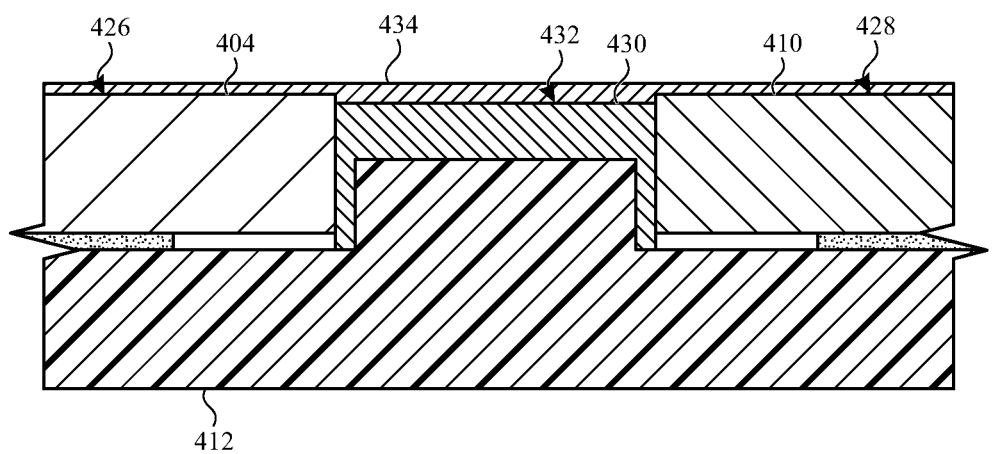
FIG. 4G shows a cross-section view of a portion of the housing of FIG. 4F taken along line 4G-4G.

FIGS. 4F and 4G show second ink layer 434 disposed in the gap (G) (see, FIGS. 4A and 4B) formed between body 404 and antenna window 410. Additionally as shown in FIGS. 4F and 4G, second ink layer 434 is over-disposed or printed within the gap (G), and as a result, a portion of second ink layer 434 is disposed over a portion of body 404 and antenna window 410. Similar to FIG. 4C, second ink layer 434 is disposed within the gap (G) and on portions of body 404 and antenna window 410 using an ink dispensing component 440.

As shown in FIG. 4G, a portion of second ink layer 434 is disposed within the gap (G) over surface 432 of first ink layer 430. Additionally, second ink layer 434 is disposed over exposed surface 426 of body 404 and exposed surface 428 of antenna window 410, respectively. Second ink layer 434 is disposed over first ink layer 430, body 404 and antenna window 410 to ensure that the gap (G) formed between body 404 and antenna window 410 is substantially filled, and/or to ensure that first ink layer 430 is substantially protected from damage by second ink layer 434, as discussed herein. Second ink layer 434 is formed from a curable, clear or transparent ink having unique properties and/or characteristics, as discussed herein with respect to FIG. 2 and discussed below.

The process performed on body 404 and antenna window 410 as shown and discussed herein with respect to FIGS. 4F and 4G corresponds to operation 308 of the process 300 shown in FIG. 3.

Figure 4H:
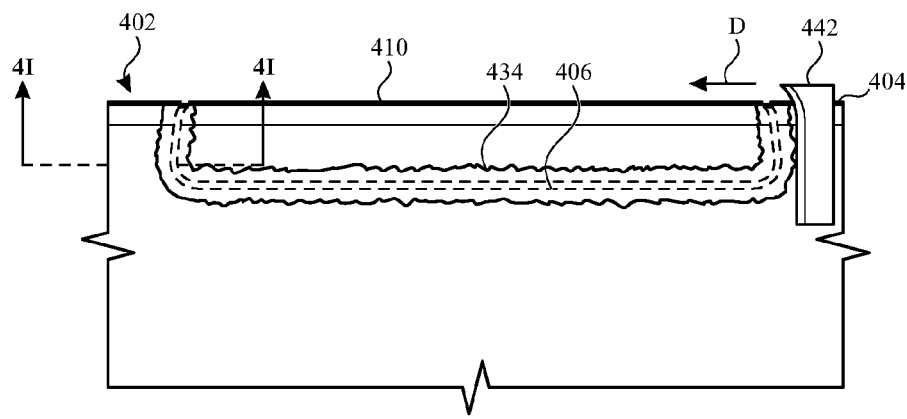
FIG. 4H shows an enlarged view of the portion of the housing of FIG. 4F after a portion of the second ink layer is removed from the housing.
Figure 4I:
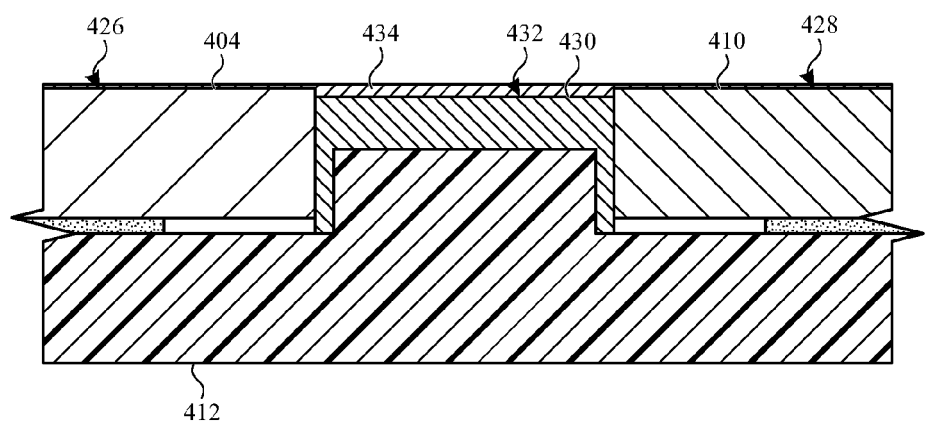
FIG. 4I shows a cross-section view of a portion of the housing of FIG. 4H taken along line 4I-4I.

FIGS. 4H and 4I show at least a part of second ink layer 434 removed prior to performing a curing process. Specifically, as shown in FIG. 4I, at least a part of second ink layer 434 previously disposed over first ink layer 430, body 404 and antenna window 410 is removed. With comparison to FIG. 4G, second ink layer 434 (formed over first ink layer 430, exposed surface 426 of body 404 and exposed surface 428 of antenna window 410) has a reduced thickness, as a result of removing a part of second ink layer 434. The removal of an excess part of second ink layer 434 can be achieved by scraping second ink layer 434 from first ink layer 430, body 404 and antenna window 410. As shown in FIG. 4H, an ink removal tool 442 can be used to remove and/or scrape an excess part of second ink layer 434 to reduce the thickness and/or amount of second ink layer 434 disposed over first ink layer 430, body 404 and antenna window 410. In non-limiting examples, ink removal tool 442 can be a blade (e.g., doctor blade), a flexible scraper, or the like that is configured to remove a part of second ink layer 434.

The process performed on body 404 and antenna window 410 as shown and discussed herein with respect to FIGS. 4H and 4I corresponds to operation 310 of the process 300 shown in FIG. 3.

Figure 4J:
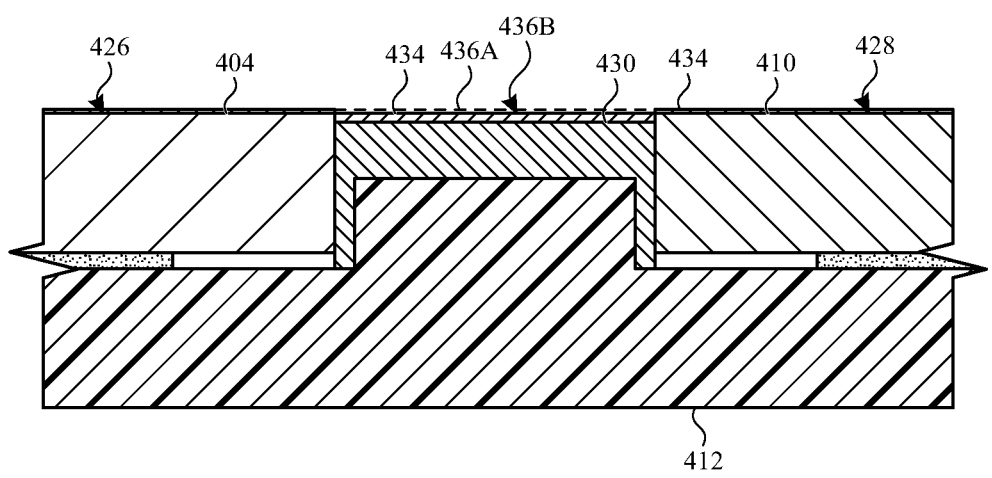
FIG. 4J shows a cross-section view of a portion of the housing of FIG. 4H taken along line 4I-4I subsequent to the second ink layer being cured.

FIG. 4J shows a cross-section view of housing 402 subsequent to performing a curing process on second ink layer 434 and the curable, transparent or clear ink forming second ink layer 434. As shown in FIG. 4J, and with comparison to FIG. 4I, curing second ink layer 434 results in the shrinkage of second ink layer 434 and the curable, clear ink forming second ink layer 434. Pre-cured surface 436A (shown in phantom) and post-cured surface 436B of second ink layer 434 are shown in FIG. 4J. The post-cured surface 436B of second ink layer 434 is positioned below the pre-cured surface 436A of second ink layer 434 as a result of second ink layer 434 shrinking during the curing process.

However, and as discussed herein with respect to FIG. 2, second ink layer 434 is formed from a material having low-shrinkage properties and/or characteristics. As a result, the shrinking of second ink layer 434 during the curing process is substantially small and/or negligible. Having low-shrinkage properties and/or characteristics for second ink layer 434 can ensure that second ink layer 434 exposed in housing 402 is not formed substantially below body 404 and antenna window 410, which would create an undesirable transition between body 404 and antenna window 410 in housing 402. Specifically, as shown in FIG. 4J, second ink layer 434 can shrink a minimal amount, such that surface 436B is positioned below exposed surface 426 of body 404 and exposed surface 428 of antenna window 410 by less than approximately 5 µm in one embodiment. A 5 µm (or smaller) difference in surface separation between surface 436B of second ink layer 434 and body 404/antenna window 410 may not be tactilely detectable by a human, as discussed herein. Additionally, more layers can be applied to remediate a thickness loss/shrinkage of the second ink layer. As similarly discussed herein with respect to FIG. 4E, the curing process performed on second ink layer 434 can include, but is not limited to, a thermal curing process or an ultraviolet (UV) curing process, and is dependent upon the type of curable ink forming first ink layer 430.

Additionally as a result of performing the curing process, second ink layer 434 is bonded to first ink layer 430. Specifically, second ink layer 434 is bonded to surface 432B of first ink layer 430. Second ink layer 434 is bonded to first ink layer 430 as a result of curing second ink layer 434, the material composition of the curable, clear ink of second ink layer 434 and/or the material composition of the curable, colored ink of first ink layer 434.

Additionally, and for similar reasons, curing second ink layer 434 also results in the prevention of a bond (or formation of a weak bond) being formed between second ink layer 434 and body 404/antenna window 410. That is, the material composition of the curable, clear ink of second ink layer 434 and/or the material composition of body 404 and antenna window 410 can prevent second ink layer 434 from bonding (or permit only weakly bonding) to body 404 and antenna window 410, respectively. As discussed herein with respect to FIG. 2, the curable, clear ink forming second ink layer 434 can be compositionally configured to not bond (or bond weakly) with specific types of materials (e.g., metals) when second ink layer 434 undergoes a curing process. Preventing the bond (and/or permitting a weak bond) from being formed between second ink layer 434 and body 404/antenna window 410 can aid in the removal of second ink layer 434 from body 404 and antenna window 410, as discussed herein.

The process performed on body 404 and antenna window 410 as shown and discussed herein with respect to FIG. 4J corresponds to operation 312 of the process 300 shown in FIG. 3.

Figure 4K:
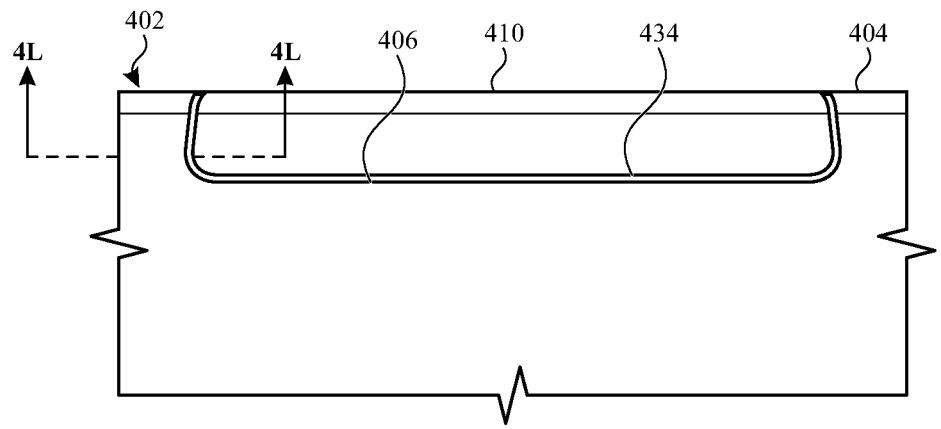
FIG. 4K shows an enlarged view of the portion of the housing of FIG. 4H after a remaining portion of the second ink layer is removed from the body and antenna window of the housing.
Figure 4L:
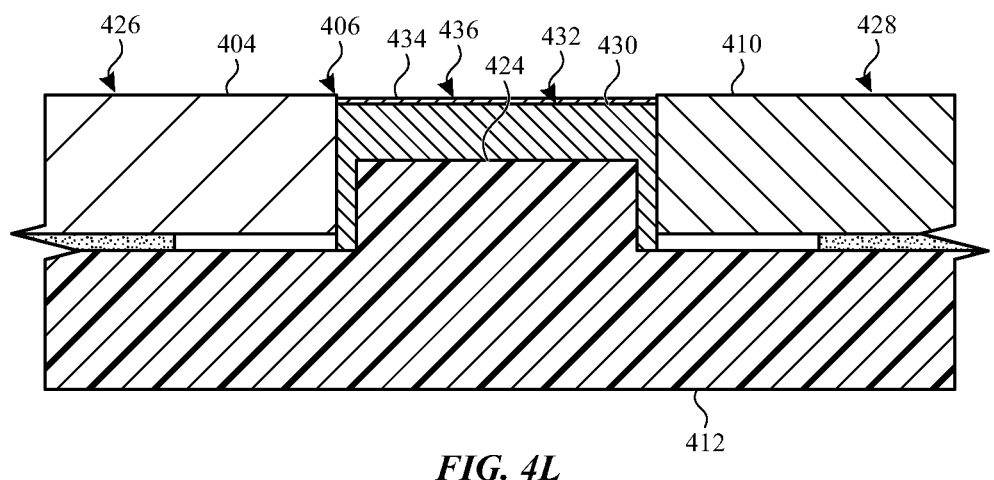
FIG. 4L shows a cross-section view of a portion of the housing of FIG. 4K taken along line 4L-4L.

FIGS. 4K and 4L show the remaining part of second ink layer 434 disposed over body 404 and antenna window 410 removed from housing 402. Specifically, the parts and/or residues of second ink layer 434 that were not previously removed by ink removal tool 442 (see, FIG. 4H) prior to curing second ink layer 434 are removed subsequent to performing the curing process on second ink layer 434. The parts and/or residues of second ink layer 434 removed from exposed surface 426 of body 404 and exposed surface 428 of antenna window 410 are removed using a solvent. Specifically, the parts and/or residues of second ink layer 434 still disposed on body 404 and antenna window 410 are exposed to a solvent. As a result of no bond (or weak bonding) being formed between second ink layer 434 and body 404/antenna window 410 during the curing process, as discussed above, the solvent can substantially surround and/or penetrate the parts of second ink layer 434 still disposed over body 404 and antenna window 410 and dissolve and/or break down the ink. Subsequent to being exposed to the solvent, second ink layer 434 (and/or its residues) is then removed, scraped or wiped away from the exposed surfaces 426, 428 of body 404 and antenna window 410, respectively, after the solvent substantially dissolves or breaks down second ink layer 434. In a non-limiting example, the solvent used to remove the parts of cured second ink layer 434 disposed over body 404 and antenna window 410 includes isopropyl alcohol (IPA). However, it is understood that other suitable solvents can be used to remove the cured parts of second ink layer 434 from body 404 and antenna window 410. Additionally, the second ink layer residues can first be removed with a tape, followed by wiping with a solvent.

FIG. 4L shows housing 402 as a final product that can be implemented for use with an electronic device, as discussed herein. As shown in FIG. 4L, and as discussed herein with respect to FIG. 2, second ink layer 434 is formed over first ink layer 430 to protect first ink layer 430 and/or prevent first ink layer 430 from being directly exposed within housing 402. Additionally, because second ink layer 434 is formed from a clear or transparent ink, and first ink layer 430 is formed from a colored ink, the colored ink of first ink layer 430 is visible in housing 402 through second ink layer 434.

Additionally as shown in FIG. 4L, and as previously discussed herein with respect to FIG. 4J, exposed surface 436 of second ink layer 434 is positioned below exposed surface 426 of body 404 and exposed surface 428 of antenna window 410, respectively. However, because second ink layer 434 has a low-shrinkage chemical and/or material composition, exposed surface 36 is only positioned below exposed surface 426 of body 404 and exposed surface 428 of antenna window 410 a distance of approximately 5 µm. In this embodiment, the distance in which exposed surface 436 is positioned below exposed surface 426 of body 404 and exposed surface 428 of antenna window 410 is sufficiently small that user of housing 402 may not tactilely perceive the transition between body 404, antenna window 410 and second ink layer 434 positioned in the gap (G) therebetween. As such, although housing 402 is formed from distinct portions (e.g., body 404, antenna window 410), second ink layer 434 disposed in the gap (G) makes the transition from and/or over the surface of housing 202 feel contiguous. As such, the structural discontinuities of housing 202 are tactilely and/or visually imperceptible to a user of housing 202, although this may not be true in all embodiments and there is no requirement that any embodiment have a tactile imperceptibility, a visual imperceptibility, or both at a gap or transition.

The process performed on body 404 and antenna window 410 as shown and discussed herein with respect to FIGS. 4K and 4L corresponds to operation 314 of the process 300 shown in FIG. 3.

Figure 5:
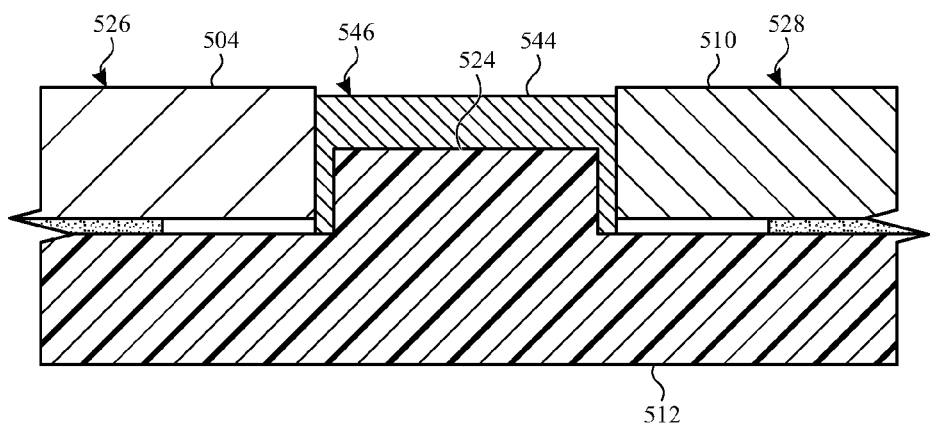
FIG. 5 shows a cross-section view of a portion of a housing formed from a body portion and an antenna window.

FIG. 5 shows housing 502 according to an additional embodiment. Housing 502 includes substantially similar components and portions as discussed herein with respect to FIGS. 1A-2 and 4A-4L. Redundant explanation of these components is omitted for clarity.

As shown in FIG. 5, insert 512 is coupled and/or adhered to body 504 and antenna window 510, and includes protrusion 524 extending into a portion of the gap (G) (see, FIG. 2) formed between body 504 and antenna window 510, as similarly discussed herein. However, as opposed to certain of the inserts discussed herein, insert 512 includes a predetermined or desired color. Similar to first ink layer 230 discussed herein with respect to FIG. 2, insert 512 includes a desired color that substantially matches and/or corresponds to the color of body 504 and antenna window 510. As discussed herein, the desired color of insert 512 is visible in the gap (G) formed in housing 502.

Housing 502 only includes a single ink layer 544 disposed within the gap (G) formed between body 504 and antenna window 510. As shown in FIG. 5, and similarly discussed herein, single ink layer 544 is disposed within the gap (G) and is disposed over and/or covers insert 512. Additionally, single ink layer 544 includes an exposed surface 546 positioned adjacent and/or minimally (e.g., less than 5 µm) below exposed surface 526 of body 504 and exposed surface 528 of antenna window 510, respectively. Single ink layer 544 is formed from a curable, clear or transparent ink, similar to the ink forming second ink layer 234 discussed herein with respect to FIG. 2. As a result of forming single ink layer 544 from a clear or transparent ink, the color of insert 512 is visible in the gap (G) of housing 502, through single ink layer 544.

Figure 6A:
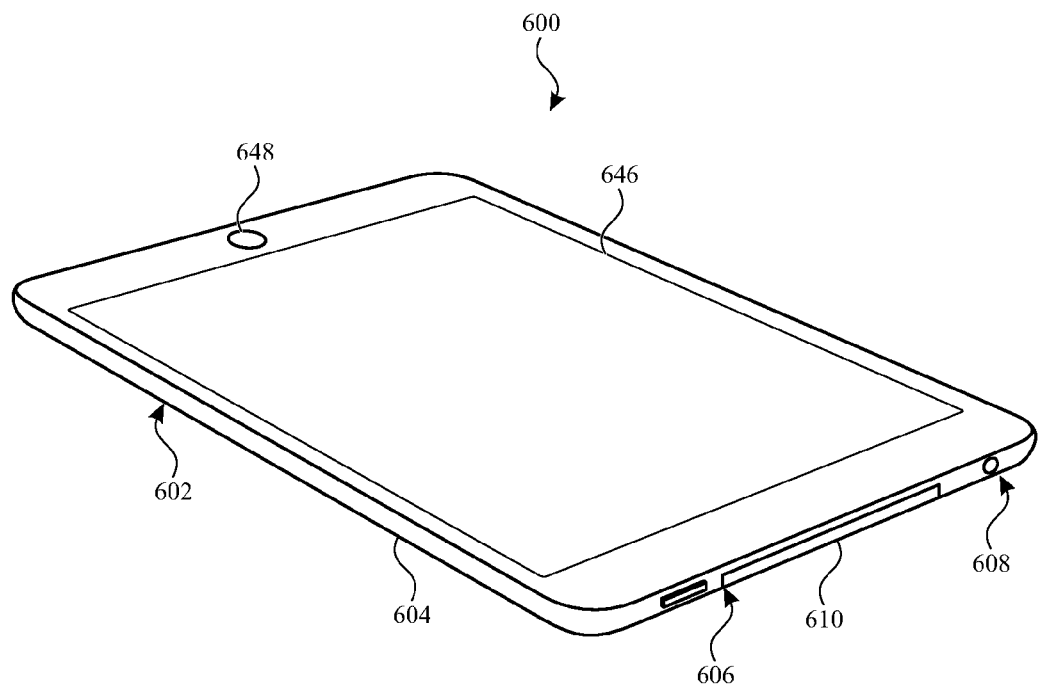
FIG. 6A shows a front view of an electronic device including a housing formed from a body portion and an antenna window.
Figure 6B:
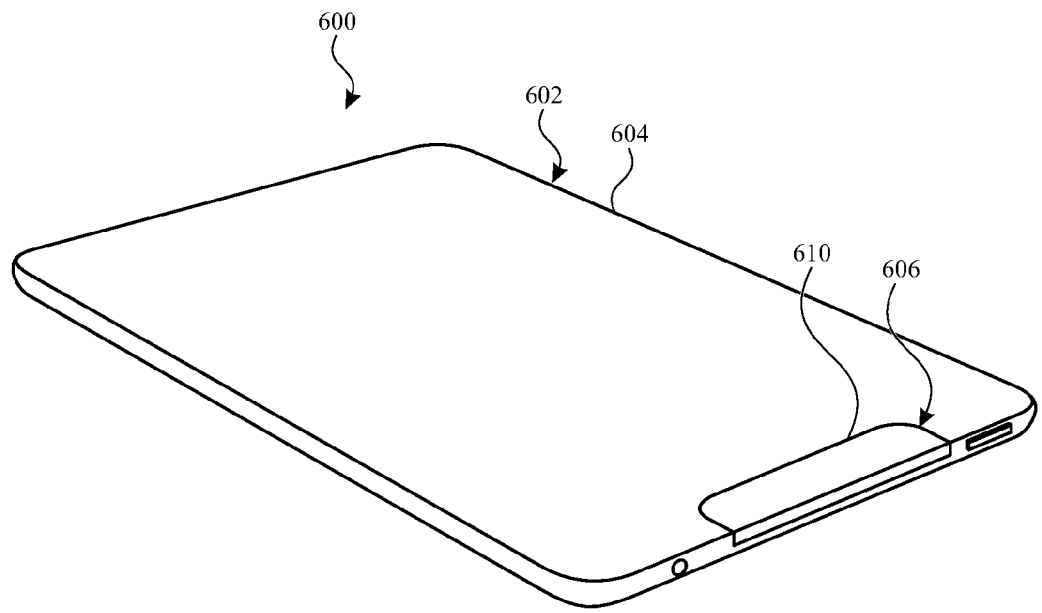
FIG. 6B shows a back view of the electronic device of FIG. 6A.

FIGS. 6A and 6B show front and back views of an electronic device 600 that utilizes housing 602, as discussed herein with respect to FIGS. 1A-5. Specifically, electronic device 600 includes housing 602 including body 604, antenna window 610 and a gap (G) (see, FIG. 1B) formed between body 604 and antenna window 610 at an end 608 of housing 602. The gap (G) is sized to allow electromagnetic waves of an antenna (not shown) to be transmitted through housing 602 and/or between body 604 and antenna window 610. As shown in FIG. 6, electronic device 600 is implemented as a tablet computing device. Other embodiments can implement electronic device 600 differently, such as, for example, a mobile phone, a laptop or desktop computer, a gaming device, a display, a digital music player, a wearable computing device or display, a health monitoring device, and so on.

Electronic device 600 includes a housing 602 at least partially surrounding a display module, a cover 646 substantially covering the display module and one or more buttons or input devices 648. Housing 602 can form an outer surface or partial outer surface and protective case for the internal components of the electronic device 600 and at least partially surrounds the display module positioned within an internal cavity formed by housing 602. Housing 602 can be formed of one or more components operably connected together, such as a front piece and a back piece (not shown). Alternatively, housing 602 can be formed of a single piece operably connected to the display module. Housing 602 is formed from the ceramic material discussed herein, and as a result, undergoes the proof testing process using the testing system prior to being implemented in and/or forming a portion of electronic device 600.

The display module is substantially surrounded by housing 602 and/or is positioned within an internal cavity formed by housing 602, such that the display module is substantially protected on almost all sides by housing 602. Cover 646 also protects the display module of electronic device 600. Specifically, cover 646 is formed integral with and/or is coupled to housing 602 to substantially cover and protect the display module. Cover 646 covers at least a portion of the front surface of electronic device 600. When a user interacts with the display module of electronic device 600, the user touches or contacts cover 646. Similar to housing 602, cover 646 of electronic device 600 can be a brittle component and is therefore formed from the ceramic material discussed herein. The ceramic material forming cover 646 can undergo the proof testing process performed by the testing system discussed herein with respect to FIGS. 1A-6B. By performing the proof testing process on the ceramic material forming cover 646, it is ensured that the ceramic material forming cover 646 meets the quality and/or strength standard required for implementation within electronic device 600 and/or cover 646 and includes desired functional, operational and/or physical characteristics and properties.

Button 648 can take the form of a home button, which may be a mechanical button, a soft button (e.g., a button that does not physically move but still accepts inputs), an icon or image on a display, and so on. Further, in some embodiments, button 648 can be integrated as part of cover 646 of the electronic device 600. Button 648, like housing 602 and cover 646, is a brittle component of electronic device 600 and, as a result, is formed from the ceramic material that undergoes the proof testing process as discussed herein.

It should be appreciated that certain dimensions, distances, depths, and so on may be exaggerated in the accompanying figures in order to more clearly illustrate certain aspects of embodiments. Accordingly, the figures are illustrative only and are not meant to convey exact relationships between elements, exact dimensions, tolerances, or the like.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A housing for an electronic device comprising:
    a first portion comprising an opening;
    a second portion positioned within the opening;
    a protrusion extending into a gap formed between the first portion and the second portion;
    a first ink layer disposed within the gap and substantially surrounding the protrusion; and
    a second ink layer disposed within the gap and over the first ink layer; wherein
    the first portion, the second ink layer, and the second portion cooperate to form a substantially contiguous surface; and
    the second ink layer is positioned approximately 5 microns (μm) or less below an exposed surface of the first portion and an exposed surface of the second portion.

2. The housing of claim 1, wherein the protrusion is positioned approximately 50 μm to 200 μm below the exposed surface of the first portion and the exposed surface of the second portion.

3. The housing of claim 1, wherein at least one of the first ink layer, the second ink layer or an insert substantially seals the gap formed between the first portion and the second portion.

4. The housing of claim 1, wherein the gap formed between the first portion and the second portion is sized to allow electromagnetic waves to pass between the first portion and the second portion.

5. The housing of claim 1, wherein:
    a transition between the first portion and the second ink layer is tactilely imperceptible; and
    a transition between the second portion and the second ink layer is tactilely imperceptible.

6. The housing of claim 1, wherein the second ink layer is disposed on the first ink layer.

7. A method of forming a housing for an electronic device, comprising:
    coupling an insert to a first portion and a second portion of the housing, a protrusion of the insert extending within a gap between the first portion and second portion;
    disposing a first ink layer within the gap;
    curing the first ink layer;
    disposing a second ink layer within the gap and over the first ink layer, an exposed surface of the first portion, and an exposed surface of the second portion;
    removing at least part of the second ink layer; and
    curing the second ink layer; wherein
    a top surface of the second ink layer is within 10 microns of a top surface of the second portion of the housing.

8. The method of claim 7, further comprising removing part of the second ink layer disposed over the exposed surface of the first portion of the housing or the exposed surface of the second portion of the housing.

9. The method of claim 7, wherein removing the part of the second ink layer comprises scraping at least the part of the second ink layer from the exposed surface of the first portion and the exposed surface of the second portion using an ink removal tool.

10. The method of claim 7, wherein coupling the insert to the first portion and the second portion of the housing comprises adhering the insert to an interior surface of the first portion and an interior surface of the second portion.

11. The method of claim 7, wherein disposing the first ink layer within the gap comprises substantially covering the protrusion with the first ink layer.

12. The method of claim 7, wherein curing the first ink layer comprises bonding the first ink layer to the insert.

13. The method of claim 7, wherein curing the first ink layer comprises shrinking the first ink layer.

14. The method of claim 7, wherein curing the second ink layer comprises:
    bonding the second ink layer to the first ink layer; and
    substantially preventing a strong bond from forming between the second ink layer and at least one of the exposed surface of the first portion of the housing and the exposed surface of the second portion of the housing.

15. The method of claim 7, further comprising:
    bonding the second ink layer to the first ink layer; and
    locally curing only portions of the first and second ink layers located inside the gap.

16. The method of claim 7, wherein curing the second ink layer comprises shrinking the second ink layer.

17. An electronic device comprising:
    a housing comprising:
        a body including an opening formed in an end of the housing; and
        an antenna window positioned within the opening of the body, the antenna window separated from the body via a gap;

a plastic insert coupled to the housing and the antenna window, the plastic insert comprising a protrusion extending into a portion of the gap between the housing and the antenna window; and at least one ink layer disposed within the gap, the at least one ink layer exposed between the housing and the antenna window.

18. The electronic device of claim 17, wherein:

the at least one ink layer is formed from a substantially clear and transparent ink; and the desired color of the plastic insert is visible between the body and the antenna window through the substantially clear and transparent ink.

19. The electronic device of claim 17, wherein a first ink layer is formed from a colored ink.

20. The electronic device of claim 19, wherein a second ink layer is formed from a clear ink, the clear ink allowing the colored ink of the first ink layer to be visible between the body and the antenna window.

\* \* \* \* \*